United States Patent
Kuramoto

(10) Patent No.: US 7,910,871 B2
(45) Date of Patent: Mar. 22, 2011

(54) INJECTION-LOCKED LASER, INTERFEROMETER, EXPOSURE APPARATUS, AND DEVICE MANUFACTURING METHOD

(75) Inventor: Yoshiyuki Kuramoto, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 43 days.

(21) Appl. No.: 12/548,100

(22) Filed: Aug. 26, 2009

(65) Prior Publication Data

US 2009/0316123 A1 Dec. 24, 2009

Related U.S. Application Data

(62) Division of application No. 11/935,035, filed on Nov. 5, 2007, now Pat. No. 7,608,808.

(30) Foreign Application Priority Data

Nov. 7, 2006 (JP) ................................ 2006-302131
Oct. 19, 2007 (JP) ................................ 2007-273089

(51) Int. Cl.
*G01J 1/32* (2006.01)

(52) U.S. Cl. ........................ 250/205; 372/18; 356/450

(58) Field of Classification Search .................. 250/205; 359/278, 277, 279, 618; 372/18; 355/67, 355/77; 356/450, 456
See application file for complete search history.

(56) References Cited

U.S. PATENT DOCUMENTS

| | | | |
|---|---|---|---|
| 6,141,138 A | 10/2000 | Machida et al. | |
| 2001/0020195 A1 | 9/2001 | Patel et al. | |
| 2002/0034198 A1 | 3/2002 | Masuda | |
| 2006/0007418 A1 | 1/2006 | Hamatani et al. | |
| 2006/0097205 A1 | 5/2006 | Kakuchi et al. | |
| 2007/0041409 A1* | 2/2007 | Sudarshanam et al. ........... 372/6 |

FOREIGN PATENT DOCUMENTS

| | | |
|---|---|---|
| EP | 0 875 743 A1 | 11/1998 |
| JP | 6-318759 A | 11/1994 |
| JP | 11-101694 A | 4/1999 |
| JP | 2004-069333 A | 3/2004 |

OTHER PUBLICATIONS

Lesage, N. et al.; "Servo-Loop Based on Heterodyne Interferometry for Injection Locking of cw Nd:YAG Lasers"; Optics Communications, North-Holland Publishing Co., Amsterdam, NL, vol. 115, No. 3/4, Mar. 15, 1995, pp. 291-296.
Musha, M. et al.; "Wideband and High Frequency Stabilization of an Injection-Locked Nd:YAG Laser to a High-Finesse Fabry-Perot Cavity"; Optics Letters, OSA, Optical Society of America, Washington DC, US, vol. 22, No. 15, Aug. 1, 1997, pp. 1177-1179. Communication from European Patent Ofice dated Feb. 28, 2008 ref. EP53217 concerning appln. No. 07120069.5-2222 including European Search Report dated Feb. 8, 2008.
Rahn, L.; "Feedback stabilization of an injection-seeded Nd:YAG laser"; Applied Optics, vol. 24, No. 7, Apr. 1, 1985, pp. 940-942.
Korean Office Action issued Aug. 4, 2008, concerning the corresponding Patent Application No. 10-2007-0112412.

* cited by examiner

*Primary Examiner* — Thanh X Luu
*Assistant Examiner* — Francis M Legasse, Jr.
(74) *Attorney, Agent, or Firm* — Rossi, Kimms & McDowell LLP

(57) ABSTRACT

An injection-locked laser is disclosed. The injection-locked laser comprises a seed laser, an oscillator into which a certain component of light output from the seed laser is injected as seed laser light, a frequency converter which shifts a frequency of the remaining component of the light output from the seed laser, a photodetector which detects light obtained by synthesizing the light output from the oscillator and the light output from the frequency converter, and a controller which controls an optical path length of the oscillator based on a beat signal component contained in the signal output from the photodetector.

13 Claims, 9 Drawing Sheets

INJECTION-LOCKED LASER, INTERFEROMETER, EXPOSURE APPARATUS, AND DEVICE MANUFACTURING METHOD

CROSS REFERENCE TO RELATED APPLICATION

This is a divisional of and claims priority from U.S. patent application Ser. No. 11/935,035 filed Nov. 5, 2007, the content of which is incorporated herein by reference.

BACKGROUND OF THE INVENTION

1. Field of the Invention

The present invention relates to an injection-locked laser, an interferometer, an exposure apparatus, and a device manufacturing method.

2. Description of the Related Art

FIG. 7 is a view showing the schematic arrangement of a conventional injection-locked laser (see J. Rahn, "Feedback stabilization of an injection-seeded Nd:YAG laser", App. Opt., 24, 940 (1985)). The injection-locked laser shown in FIG. 7 adopts an injection locking method of minimizing the buildup time.

A pulse oscillator O for generating pulse light is, generally, of a ring type to avoid any influence of spectral hole burning. A PZT mount 4 mounts an output coupler of the pulse oscillator O. A PZT controller (PZT amplifier) 5 accurately drives the PZT mount 4. A laser gain medium 3 can employ, for example, a Ti:sapphire crystal. An excitation light source 2 made of, for example, Nd:YAG can be used to excite the crystal by irradiating the crystal with a light beam so that the crystal absorbs the light beam.

A seed laser 1 is an injection light source for injection locking and uses a single longitudinal mode light source having a sufficiently narrow full width at half maximum. Seed laser light output from the seed laser 1 is injected into the pulse oscillator so that it matches the transverse mode of the pulse oscillator O. The seed laser 1 can use, for example, an external oscillator type semiconductor laser.

The injection locking means locking the wavelength of narrow-band laser light injected into the oscillator with the optical path length of the oscillator. Photons of the injected narrow-band laser light play the part of evoking stimulated emission for initial pulse oscillation. This facilitates pulse oscillation while concentrating excitation energy in a narrow band.

When the optical path length of the pulse oscillator O is an integer multiple of the oscillation wavelength of the seed laser 1, the efficiency of injection locking is highest and the buildup time is shortest. Under other conditions, the buildup time is long because the oscillator generates a loss with respect to the seed laser 1.

The buildup time means the time from pump laser emission until pulse light oscillation. The above-described principle is used for oscillator control based on the buildup time.

To detect the buildup time, an excitation light source photodetector 32 and pulse light photodetector 33 are inserted near the oscillator. The outputs from the photodetectors 32 and 33 are sent to a control circuit 34. The control circuit 34 calculates the buildup time based on the signals output from the two photodetectors 32 and 33, generates an error signal based on a change in buildup time, and executes PID filtering for feeding back the error signal.

The filtered signal is sent to the PZT controller 5. The PZT controller 5 drives the PZT mount 4 based on this signal so as to control injection locking.

Unfortunately, the conventional control method using the buildup time may generate a control error when a factor (e.g., pump laser intensity jitter or pointing jitter) other than the oscillator length changes the buildup time. Still worse, noise is likely to mix in a processing circuit for calculating the buildup time based on the output from the laser. This makes it difficult to generate an error signal with high SN. This produces a locking control error, resulting in laser characteristic deterioration such as intensity or wavelength jitter.

SUMMARY OF THE INVENTION

The present invention provides an injection-locked laser with good wavelength stability, an interferometer using the same, and an exposure apparatus.

According to the first aspect of the present invention, there is provided an injection-locked laser comprising a seed laser, an oscillator into which a certain component of light output from the seed laser is injected as seed laser light, a frequency converter which shifts a frequency of another component of the light output from the seed laser, a photodetector which detects light obtained by synthesizing the light output from the oscillator and the light output from the frequency converter, and a controller which controls an optical path length of the oscillator based on a beat signal component contained in the signal output from the photodetector.

According to the second aspect of the present invention, there is provided an injection-locked laser comprising a seed laser, an oscillator into which a certain component of light output from the seed laser is injected as seed laser light, a frequency converter which shifts a frequency of light output from the oscillator, a photodetector which detects light obtained by synthesizing another component of the light output from the seed laser and the light output from the frequency converter, and a controller which controls an optical path length of the oscillator based on a beat signal component contained in the signal output from the photodetector.

Further features of the present invention will become apparent from the following description of exemplary embodiments with reference to the attached drawings.

DESCRIPTION OF THE EMBODIMENTS

Preferred embodiments of the present invention will be described below with reference to the accompanying drawings.

First Embodiment

Figure 1:
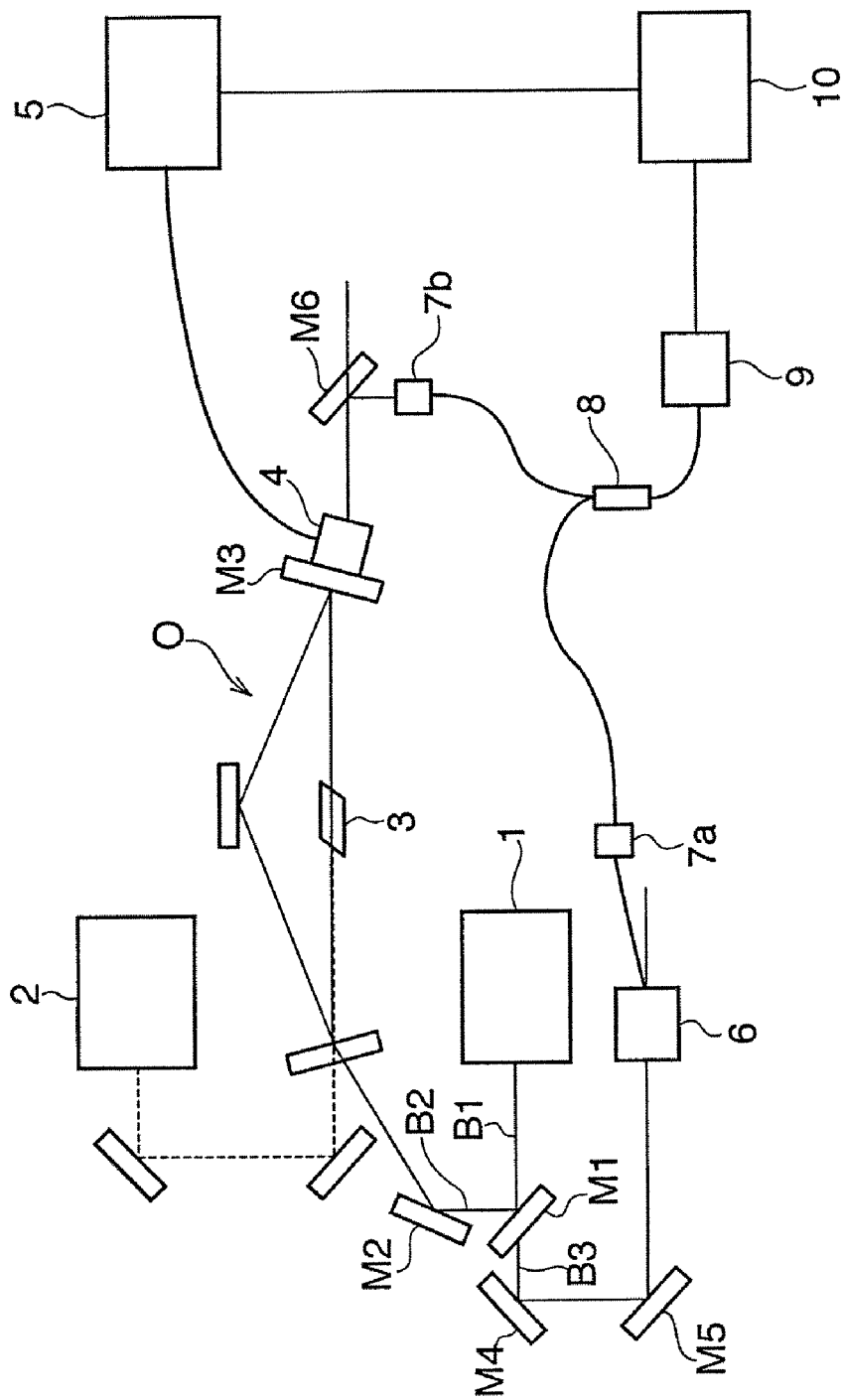
FIG. 1 is a view showing the schematic arrangement of an injection-locked pulse laser according to the first embodiment of the present invention.

FIG. 1 is a view showing the schematic arrangement of an injection-locked pulse laser according to the first embodiment of the present invention. A light beam B1 output from a seed laser 1 is split into two light beams B2 and B3 by a half mirror M1. The light beam B2 reflected by the half mirror M1 is injected into a pulse oscillator O upon being reflected by a mirror M2. The pulse oscillator O is, preferably, of a ring type to avoid any influence of hole burning. A gain medium 3 is accommodated in the pulse oscillator O and can be excited by irradiating the inside of the oscillator O with laser light emitted by an excitation light source (pump laser) 2 arranged outside the pulse oscillator O. A PZT mount 4 mounts an output coupling mirror M3 of the oscillator O. A PZT controller 5 including an amplifier controls the PZT mount 4. This makes it possible to accurately control the optical path length of the oscillator O.

The light beam B3 output from the seed laser 1 and transmitted through the half mirror M1 is guided to an acoustic optical modulator (AOM) 6 serving as a frequency converter via mirrors M4 and M5. A voltage signal having a frequency $f_{AOM}$ is supplied to the acoustic optical modulator 6. The acoustic optical effect changes the light beam transmitted through the acoustic optical modulator 6 into diffracted light beams of a plurality of orders. These diffracted light beams of the plurality of orders generate frequency shifts of $n \times f_{AOM}$ (n: order).

From these diffracted light beams of the plurality of orders, only a +1st-order light beam is spatially extracted and coupled to the first input terminal of a fiber splitter 8 by a fiber coupler 7a. The fiber splitter 8 is of, for example, a polarization-preserving single mode type which includes two input terminals (first and second input terminals) and one output terminal.

In the same way, the output from the pulse oscillator O is partially split by a half mirror M6 and coupled to the second input terminal of the fiber splitter 8 by a fiber coupler 7b.

The fiber splitter 8 is suitable to spatially superpose the outputs from the seed laser 1 and pulse oscillator O. The polarization-preserving type fiber splitter is also suitable to maximize the beat signal amplitude between two light beams and to prevent a change in polarization due to, for example, a change in stress to the fiber. As a matter of course, instead of the fiber splitter, a half mirror or the like may be used to superpose the light beams.

Figure 2:
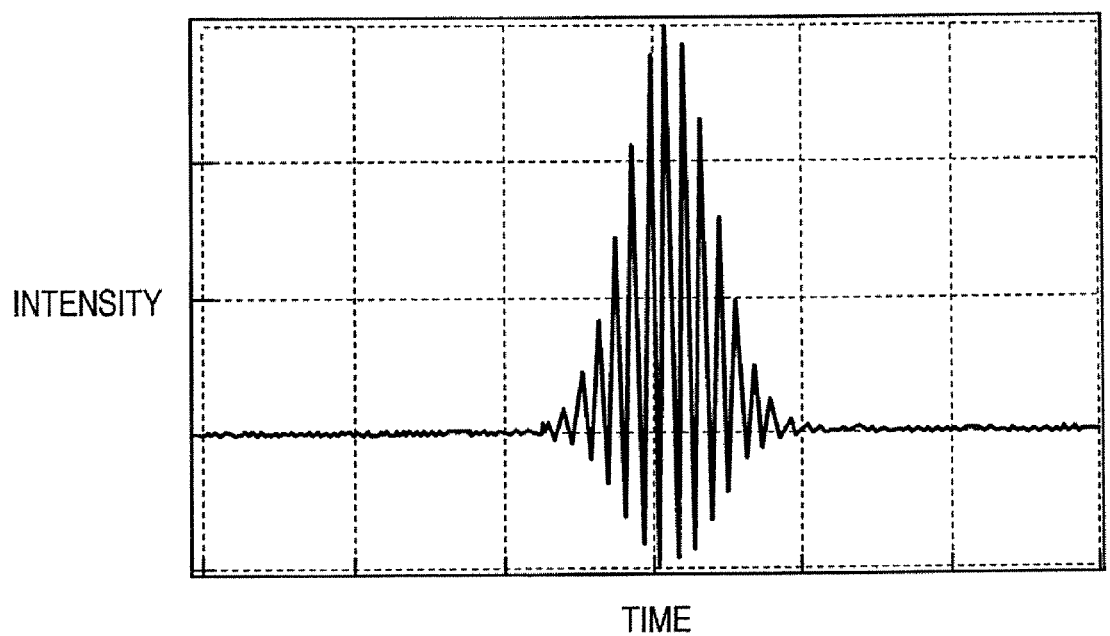
FIG. 2 is a chart illustrating a beat signal I(t) obtained by simulation.

The output terminal of the fiber splitter 8 connects to a photodetector 9. The photodetector 9 converts the intensity of the light output from the fiber splitter 8 into an electrical signal. Since the fiber splitter 8 synthesizes the light output from the seed laser 1 and shifted in frequency via the acoustic optical modulator 6 and that output from the pulse oscillator O, a signal output from the photodetector 9 is given by:

$$I(t) = I_{seed} + I_{pulse}(t) + \qquad (1)$$
$$2\sqrt{I_{seed}I_{pulse}(t)} \cos(2\pi(f_{pulse} - f_{seed} + f_{AOM}) \cdot t)$$
$$= I_{seed} + I_0 \exp(-(t/a)^2) +$$
$$2\sqrt{I_{seed}I_0} \exp(-(t/a)^2/2)\cos(2\pi(f_{pulse} - f_{seed} + f_{AOM}) \cdot t)$$

where $I_{seed}$ is the seed laser intensity, $I_{pulse}$ is the pulse oscillator output, $f_{seed}$ is the seed laser optical frequency, and $f_{pulse}$ is the pulse laser central optical frequency. The signal I(t) given by equation (1) will be referred to as a beat signal hereinafter. FIG. 2 is a chart illustrating the beat signal I(t) obtained by simulation.

An analyzer 10 extracts an error signal from the beat signal I(t). The process in the analyzer 10 will be explained.

First, the analyzer 10 A/D-converts a pulse beat signal I(t). A/D conversion is preferably triggered by, for example, the Q switch timing of the excitation light source (pump laser) 2. The sampling number is preferably $2^n$ in view of a subsequent FFT (Fast Fourier Transform) process.

Next, the analyzer 10 analyzes the frequency of the beat signal I(t). The analyzer 10 executes FFT for the beat signal I(t). Equation (1) is Fourier-transformed into:

$$\tilde{I}(f) = a\sqrt{\pi}(I_0 \exp(-(a\pi f)^2) + \sqrt{2I_{seed}I_0}\exp(-2(a\pi(f-(f_{pulse}-f_{seed}+f_{AOM})))^2)) \qquad (2)$$

Figure 3:
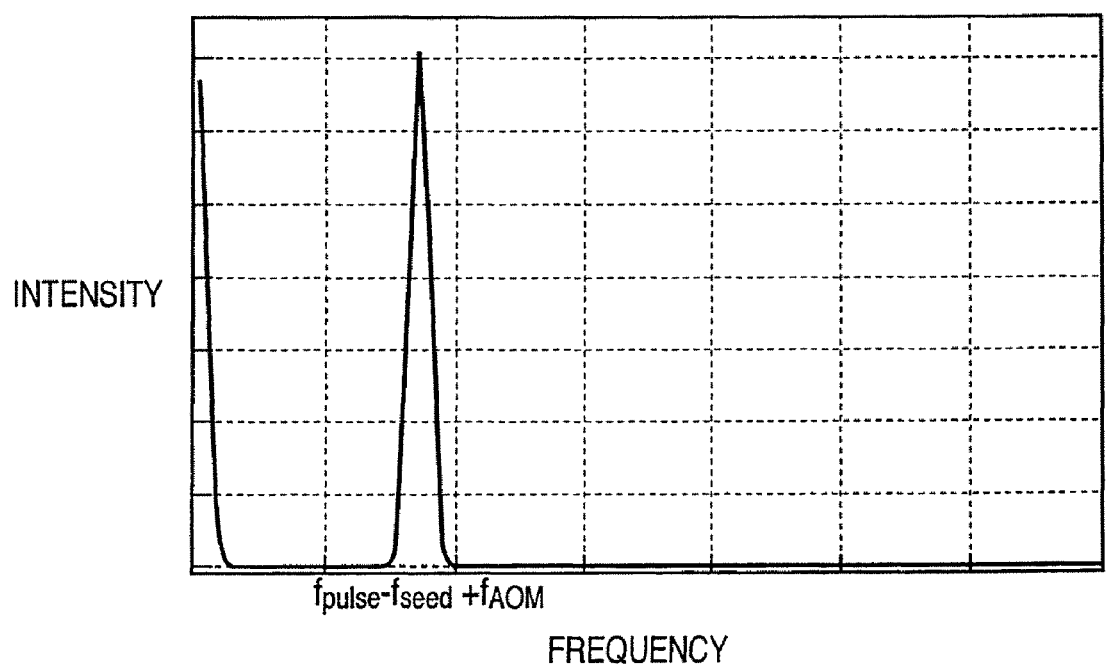
FIG. 3 is a chart illustrating the Fourier transform of the beat signal.

FIG. 3 exemplifies the Fourier transform given by equation (2). As is obvious from equation (2), the spectrum around $F_{AOM}$ indicates the frequency difference between pulse light from the pulse oscillator O and light from the seed laser 1. To extract the frequency information of the pulse light from the pulse oscillator O, the modulation frequency $f_{AOM}$ (frequency shift amount) of the AOM 6 must be sufficiently greater than the spectral width of the pulse light.

The analyzer 10 calculates the weighted mean of the spectrum. The analyzer 10 uses not the peak position but the weighted mean of the spectrum because of the following reasons. That is, in the peak position, the resolution of FFT limits that of an error signal, and the wavelength stability influences only a change in the weighted mean of the spectrum in an application of, for example, an interferometer.

In an actual system, noise data may mix in a region, which must be normally free from any spectral component, due to noise produced by the photodetector 9 or the A/D converter in the analyzer 10, resulting in a calculation error of the weighted mean. This problem can be avoided by determining a threshold value equivalent to the system noise level in advance and performing calculation in consideration of only data having noise levels higher than this threshold value. Since spectral components which do not depend on the pulse frequency are present around the DC level, it is necessary to designate the calculation region of the weighted mean in advance to avoid this influence. Hence, the difference ($f_{pulse}-f_{seed}$) between the frequency $f_{seed}$ of the light output from the seed laser 1 and the frequency $f_{pulse}$ of the light output from the pulse oscillator O is given by:

$$f_{pulse} - f_{seed} = \sum_{i=i0}^{N-1} f_i I(f_i) \bigg/ \sum_{i=i0}^{N-1} I(f_i) - f_{AOM} \qquad (3)$$

The thus obtained result contains only the frequency difference information and does not contain sign information. However, sign determination is possible based on the direction in which the PZT mount 4 moves and the direction in which the frequency difference changes, so no problem occurs on the feedback system. In addition, even though the modulation frequency jitter of the acoustic optical modulator 6 becomes a measurement error, it is too small to influence a general optical frequency stability and hence is negligible.

Finally, the analyzer 10 D/A-converts the frequency difference ($f_{pulse}-f_{seed}$) and outputs the conversion result as an analog error signal. Since the laser according to the first embodiment is a pulse laser, the error signal is held until the next pulse is generated.

The analyzer 10 desirably executes this process for every pulse to increase the control frequency of the pulse oscillator O. When the analyzer 10 is formed using an FPGA (Field Programmable Gate Array), it can perform analysis at a repeating frequency of about, for example, 10 kHz.

The error signal output from the analyzer 10 is sent to the PZT controller 5. This signal undergoes PID compensation in the PZT controller 5 and is then sent (fed back) to the PZT mount 4.

In the first embodiment, the pulse oscillator O is controlled such that the oscillation wavelength of pulse light becomes equal to that of the seed laser 1. This attains stable injection locking because the optical path length of the pulse oscillator is maintained at an integer multiple of the optical path length of the seed laser 1. According to the first embodiment, it is possible to directly extract a difference in wavelength in accordance with a pulse beat signal. This allows accurate injection locking control free from any influence of the intensity jitter of the excitation light source.

Second Embodiment

Figure 4:
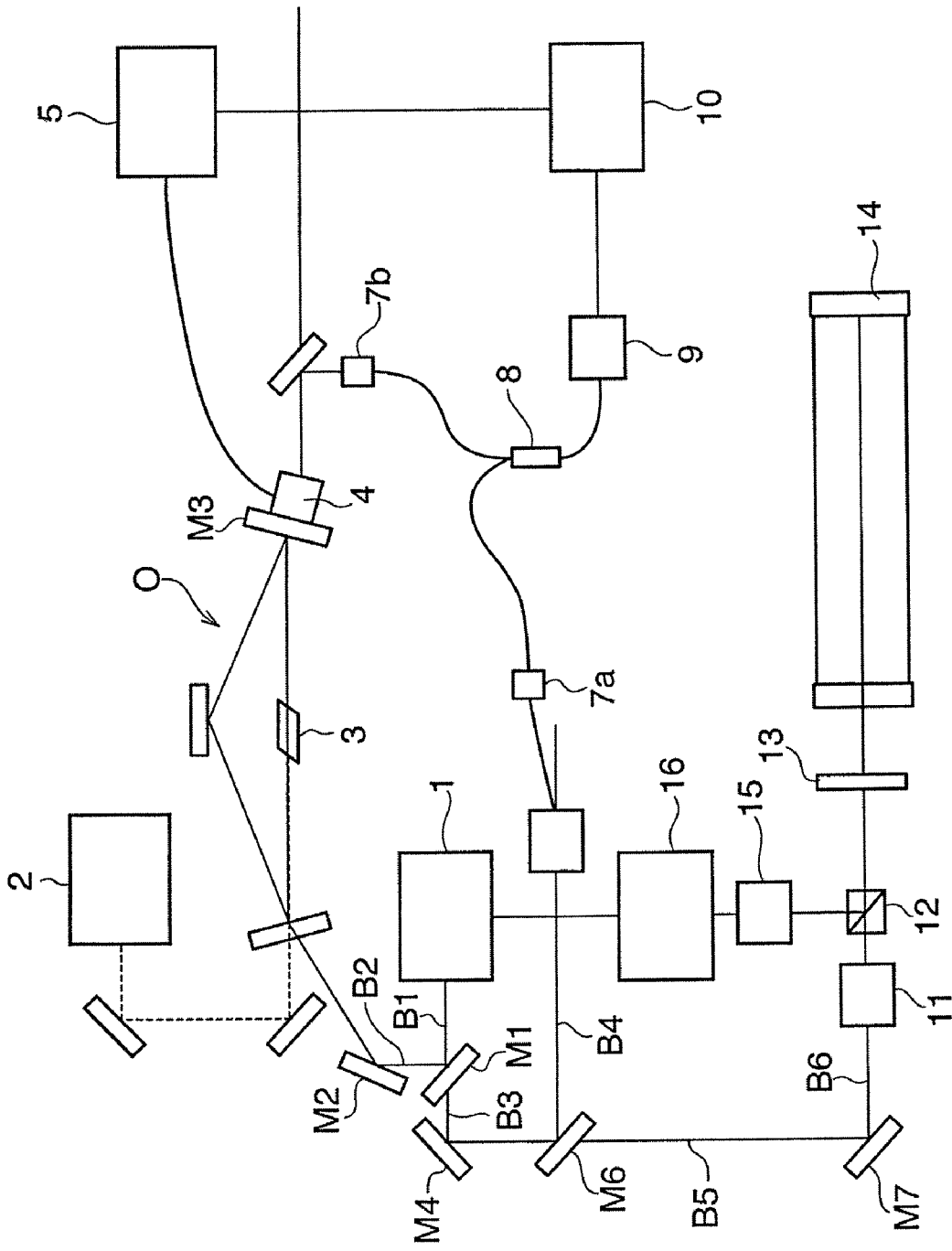
FIG. 4 is a view showing the schematic arrangement of an injection-locked pulse laser according to the second embodiment of the present invention.

FIG. 4 is a view showing the schematic arrangement of an injection-locked pulse laser according to the second embodiment of the present invention. A light beam B1 output from a seed laser 1 is split into two light beams B2 and B3 by a half mirror M1. The light beam B2 reflected by the half mirror M1 is injected into a pulse oscillator O via a mirror M2. The pulse oscillator O is, preferably, of a ring type to avoid any influence of hole burning. A gain medium 3 made of a Ti:sapphire crystal is accommodated in the pulse oscillator O. The gain medium 3 can be excited by externally irradiating the oscillator O with a second harmonic wave emitted by an excitation light source (pump laser) 2 which is made of, for example, an Nd:YAG and has a wavelength corresponding to the absorption band of the Ti:sapphire. A PZT mount 4 mounts an output coupling mirror M3 of the oscillator O. A PZT controller 5 including an amplifier controls the PZT mount 4. This makes it possible to accurately control the optical path length of the oscillator O.

The light beam B3 emitted by the seed laser 1 and transmitted through the half mirror M1 is guided to a half mirror M6 upon being reflected by a mirror M4, and is split into two light beams B4 and B5.

The light beam B5 transmitted through the half mirror M6 is guided to an electro-optic modulator 11 upon being reflected by a mirror M7, so that it undergoes phase modulation at a frequency fm. After that, the light beam B5 is transmitted through a polarizing beam splitter 12 and λ/4 plate 13 and guided to a reference resonator 14. A photodetector 15 is located on the opposite side of the polarizing beam splitter 12, and detects the amount of light supplied from the reference resonator 14.

In the second embodiment, the oscillation wavelength of the seed laser 1 is stabilized in the following way. The second embodiment adopts the Pound-Drever method. After being modulated at the frequency fm by the electro-optic modulator 11, a laser light beam B6 has a complex amplitude given by:

$$E(t) \approx E_0 \sum_{n=-\infty}^{\infty} J_n(\phi_m) \exp(2\pi i(\nu_0 + nf_m t))\{1 + \phi(t)\} \quad (4)$$

where $\nu_0$ is the central optical frequency of laser light emitted by the seed laser 1, $\phi(t)$ is the phase shift from the central optical frequency, and $\phi m$ is the modulation depth obtained by the electro-optic modulator 11.

A transfer function Hr(v) of the light reflected by the reference resonator 14 is given by:

$$H_r(\nu) = -r_1 + \frac{t_1^2 r_2 \exp(-2\pi i \nu / \nu_F)}{1 - r_1 r_2 \exp(-2\pi i \nu / \nu_F)} \quad (5)$$

where $r_1$ and $r_2$ are the amplitude reflectances of mirrors of the reference resonator 14, $\nu$ is the frequency of light emitted by the seed laser 1, and $\nu_F$ is the FSR of the reference resonator 14.

The intensity signal of the light received by the photodetector 15 is given by the product of equations (4) and (5). Extraction of only a component which oscillates at the modulation frequency fm from this signal yields:

$$I(\nu) = |E_0|^2 \sum_{n=-\infty}^{\infty} \begin{Bmatrix} H_r(\nu+nf_m)H_r^*(\nu+(n-1)f_m) \\ J_n(\phi_m)J_{n-1}(\phi_m)\exp(2\pi i f_m t) + \\ H_r(\nu+nf_m)H_r^*(\nu+(n+1)f_m) \\ J_n(\phi_m)J_{n+1}(\phi_m)\exp(-2\pi i f_m t) \end{Bmatrix} \quad (6)$$

This intensity signal is demodulated at the frequency fm to obtain a demodulated signal given by:

$$V(\nu) = -\frac{1}{2}|E_0|^2 \text{Im} \sum_{n=-\infty}^{\infty} \left\{ \frac{H_r(\nu+nf_m)H_r^*(\nu+(n+1))}{J_n(\phi_m)J_{n+1}(\phi_m)f_m} \right\} \quad (7)$$

When V(ν)=Nνf+δν, V(ν) exhibits a linear characteristic with respect to frequency errors in the neighborhood of δν to 0 and hence can be used as an error signal for frequency stabilization. A demodulator 16 demodulates a light intensity signal into an error signal and executes a filtering process for, for example, control PID. The demodulation result is fed back to the wavelength modulation terminal of the seed laser 1.

In the above-described manner, a stabilization unit including the reference resonator 14 stabilizes the oscillation wavelength of the seed laser 1 using that of the reference resonator 14 as a reference. Since a change in the frequency of the reference resonator 14 produces an error, it is necessary to sufficiently take account of a change in optical path length due to disturbance such as vibration, temperature, and noise. More specifically, it is important to provide a high-rigidity mechanical structure and low-vibration installation environment and to accommodate the injection-locked pulse laser in an air-conditioned chamber with a sound insulator.

The Pound-Drever method has a feature that the SN of an error signal depends on the finesse of the reference resonator 14. It is therefore necessary to select mirrors of the reference resonator 14 which have a sufficiently high reflectance, and also to sufficiently adjust the reference resonator 14.

The light beam B4 of the seed laser 1, which is reflected by the half mirror M6, is guided to an AOM 6. The AOM 6 receives a voltage signal having a frequency $F_{AOM}$ to generate diffracted light beams of a plurality of orders from light beams transmitted through it due to an acoustic optical effect. These diffracted light beams of the plurality of orders generate frequency shifts of $n \times f_{AOM}$.

From these diffracted light beams of the plurality of orders, only a +1st-order light beam is spatially extracted and coupled to the first input terminal of a fiber splitter 8 by a fiber coupler 7a. The fiber splitter 8 is of, for example, a polarization-preserving single mode type which includes two input terminals (first and second input terminals) and one output terminal.

In the same way, the output from the pulse oscillator O is partially split by the half mirror M6 and coupled to the second input terminal of the fiber splitter 8 by a fiber coupler 7b. A photodetector 9 converts the intensity of light output from the fiber splitter 8 into an electrical signal, and sends it to an analyzer 10.

The analyzer 10 generates a feedback signal with respect to the pulse oscillator O by the same process as in the first embodiment. This signal is fed back to the PZT mount 4 of the pulse oscillator O via the PZT controller (PZT amplifier) 5.

In the above-described manner, the pulse oscillator O is controlled such that the oscillation frequency of the pulse oscillator O coincides with that of the seed laser 1.

As described above, the seed laser 1 stabilizes a wavelength using the oscillation wavelength of the reference resonator 14 as a reference. Hence, control to maintain the oscillation wavelengths of the seed laser 1 and pulse oscillator O constant attains accurate stabilization of the pulse laser light wavelength.

Third Embodiment

Figure 5:
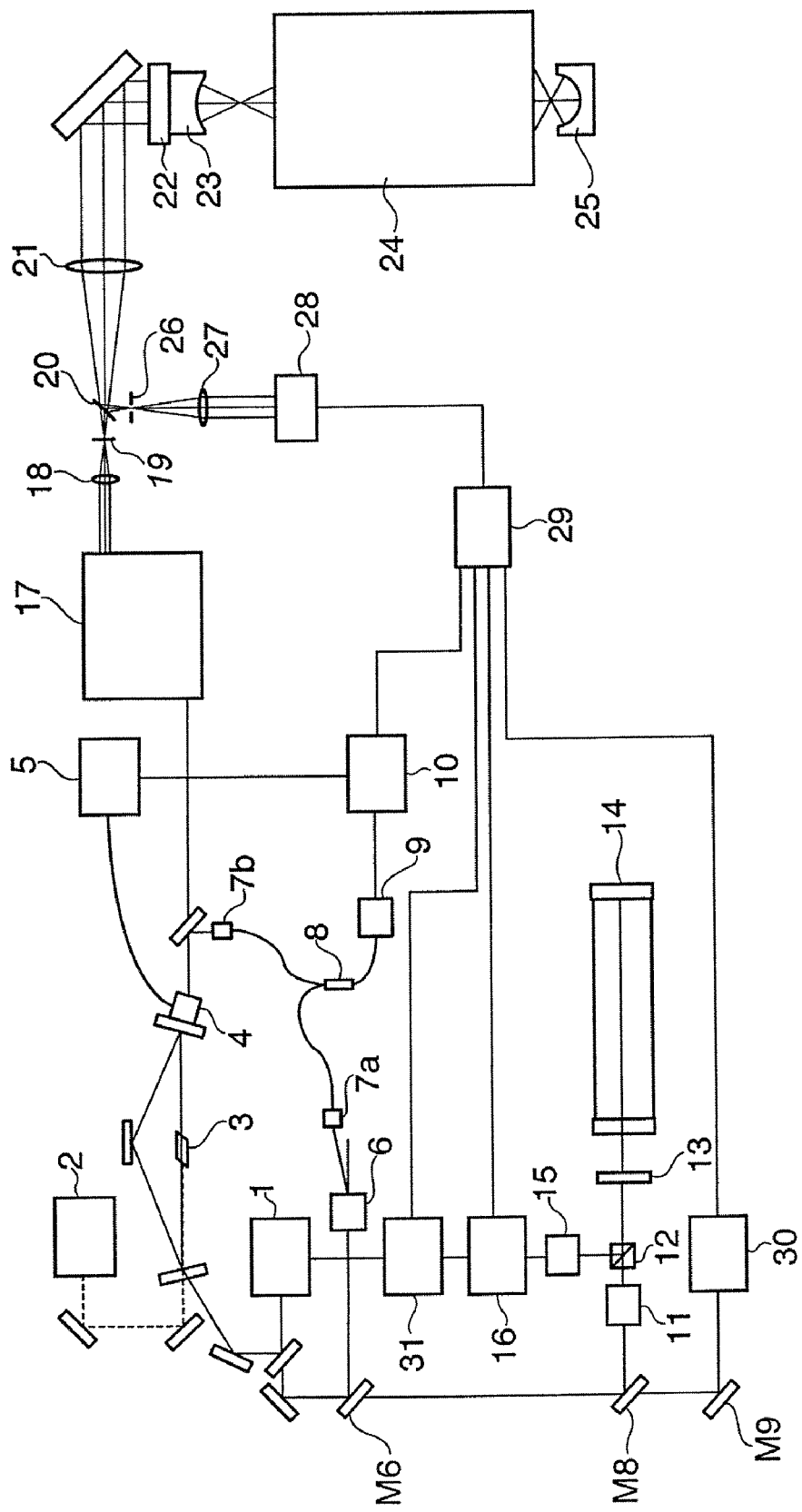
FIG. 5 is a view showing the schematic arrangement of an injection-locked pulse laser according to the third embodiment of the present invention.

FIG. 5 is a view showing the schematic arrangement of an interferometer according to the third embodiment of the present invention. The interferometer according to the third embodiment of the present invention incorporates the injection-locked pulse laser according to the second embodiment.

The interferometer according to the third embodiment of the present invention is suitable to, for example, inspect the imaging performance of a projection optical system built in an exposure apparatus such as a semiconductor exposure apparatus. The exposure apparatus uses an excimer laser of, for example, KrF or ArF as an illumination light source. For this reason, the projection optical system is designed to exhibit an optimal imaging performance at the wavelength of illumination light. An inspection apparatus for inspecting the imaging performance of the projection optical system executes inspection using a wavelength roughly equal to that of the illumination light as well. The third embodiment will exemplify an inspection apparatus for a projection optical system having an optimal wavelength of 193 nm.

An oscillation wavelength adjustment method will be explained first. The interferometer serving as the inspection apparatus comprises a wavelength conversion unit 17 at the output portion of the injection-locked pulse laser exemplified in the second embodiment. The wavelength conversion unit 17 reduces the wavelength of incident light to ¼ and outputs the converted wavelength using a nonlinear optical effect. To set the light wavelength output from the wavelength conversion unit 17 at 193 nm, it is necessary to stabilize the wavelength of light which enters the wavelength conversion unit 17, that is, the wavelength of light output from the injection-locked pulse laser at 772 nm.

A half mirror M8 substitutes for the mirror M7 according to the second embodiment. The output from a seed laser 1 is partially transmitted through the half mirror M8 and guided to a wavemeter 30 upon being reflected by a mirror M9. The light beam output from the seed laser 1 is also split and guided to a pulse oscillator O (injection locking), an AOM 6 (beat detection), and an external reference resonator 14 (wavelength stabilization), as in the second embodiment.

A precisely calibrated etalon is built in the wavemeter 30 and hence can measure the absolute wavelength value on the order of sub-pm or less. A computer 29 connects to the wavemeter 30, calculates a wavelength shift amount from the set wavelength of the seed laser 1, and sends the calculation result to an adder 31.

The adder 31 performs PID calculation for the wavelength shift amount sent from the computer 29 to generate a feedback signal using the wavemeter 30 as a reference. The adder 31 then adds the feedback signal to a feedback signal (wavelength feedback signal) from the demodulator 16 using the reference resonator 14 as a reference, and feeds back the sum to the wavelength modulation terminal of the seed laser 1.

The wavelength feedback signal and frequency feedback signal are sent to the seed laser 1. When the control frequency of the wavelength feedback signal is set sufficiently lower than that of the frequency feedback signal, it is possible to minimize any influence of interference between the wavelength feedback signal and the frequency feedback signal.

In the above-described manner, according to the third embodiment, a wavelength stabilization unit including the reference resonator 14 and wavemeter 30 attains frequency stabilization and the guarantee of the absolute value of the central wavelength of the seed laser 1. Hence, according to the third embodiment, controlling the optical path length (oscillator length) of the pulse oscillator O as in the second embodiment attains frequency stabilization and the guarantee of the central wavelength of the pulse light source.

The wavelength conversion unit 17 reduces the wavelength of the light output from the pulse oscillator O to ¼, that is, 193 nm. The coefficient of ¼ in wavelength conversion is physically fixed, and the wavelength of light output from the wavelength conversion unit 17 is determined only by the wavelength of the light which enters the wavelength conversion unit 17. Therefore, a 193-nm pulse also undergoes frequency stabilization and the guarantee of the central wavelength.

An interferometer will be explained next. The light beam which emerges from the wavelength conversion unit 17 passes through a condenser lens 18 and is then transmitted through a pinhole 19 having a size equal to or smaller than the diffraction limit, thereby shaping the wavefront. The light beam transmitted through the pinhole 19 is transmitted through a half mirror 20 while spreading, collimated into a collimated light beam by a collimator lens 21, and guided to a TS lens 23. The TS lens 23 is designed such that the radius of curvature of the final surface becomes equal to the distance from the final surface to the focal position. The TS lens 23 is coated with an antireflection film except the final surface. About 5% of the light beam guided to the final surface of the TS lens 23 is reflected due to the refractive index difference between air and glass, and returns along the incident optical path. The final surface of the TS lens will be referred to as a TS surface and the light beam reflected by the TS surface will be referred to as a reference light beam hereinafter. The TS lens 23 is fixed on a phase shift unit 22 and can be driven in the optical axis direction by a PZT element in the phase shift unit 22.

A light beam transmitted through the TS surface temporarily converges on the object plane of a projection optical system 24 of the exposure apparatus, and is then guided to the projection optical system 24 while spreading. After emerging from the projection optical system 24, the light beam converges at the image point of the projection optical system 24. A spherical RS mirror 25 having a center of curvature which coincides with the image point of the projection optical system 24 is inserted on the image side. The reflecting surface of the RS mirror 25 is made of glass without any coating, and has a reflectance of about 5% like the TS surface. The light beam converged at the image point returns along the same optical path upon being reflected by the RS surface. The reflecting surface of the RS mirror will be referred to as an RS surface and the light beam reflected by the RS surface will be referred to as a test light beam hereinafter.

Both the reference light beam and test light beam are transmitted through the TS lens 23 again, and collimated into collimated light beams. After that, these light beams are guided to the collimator lens 21 again and reflected by the half mirror 20 while converging. A spatial filter 26 is inserted at the focal position on the opposite side of the half mirror 20. After cutting off any unnecessary high-frequency ranges by the spatial filter 26, the test light beam and reference light beam are guided to an imaging lens 27, collimated into collimated light beams, and guided to an image sensor (e.g., a CCD) 28. The image sensor 28 senses interference fringes of the test light beam and reference light beam, and sends the sensed image information to a computer 29.

The interference fringes are given by:

$$I(r) = I_{ref} + I_{test} + 2\sqrt{I_{ref}I_{test}}\cos(2\cdot 2\pi(W(r)+L)/\lambda) \quad (8)$$

where $I_{ref}$ is the intensity of the reference light beam, $I_{test}$ is the intensity of the test light beam, W(r) is the wavefront of the projection optical system 24, L is the optical path length between the TS surface and the RS surface, and $\lambda$ is the wavelength of laser light.

Accurate wavefront measurement based on interference fringes can adopt a phase shift method. The phase shift method calculates a wavefront based on images of a plurality of interference fringes to which a known phase shift is given.

The computer 29 applies a voltage to the phase shift unit 22 in synchronism with the image sensing timing of the image sensor 28 to drive the TS lens 23 along the optical axis, thereby attaining a desired phase shift.

A wavefront W(r) of a test lens is given by:

$$W(r) = \tan^{-1}(Is(r)/Ic(r))/(2\cdot 2\pi) - \phi \quad (9)$$

where Ic and Is are the cosine components and sine components, respectively, of changing interference fringes, which are extracted from the plurality of interference fringe images upon a phase shift, and $\phi$ is the initial phase term.

The major factor of an error which occurs in wavefront measurement is a change in interference fringes upon a phase shift. As is obvious from equation (8), a change in interference fringes also occurs upon a change in the wavelength $\lambda$ of laser light or a change in the optical path length L between the TS surface and the RS surface due to, for example, stage vibration.

A large projection optical system for a semiconductor exposure apparatus requires an optical path length L as long as several m. This makes it impossible to neglect the influence of a change in wavelength. Since the third embodiment attains accurate wavelength stabilization, a wavefront can be measured more accurately than in the prior arts.

By connecting a wavemeter 30, demodulator 16, and analyzer 10 to the computer 29, a change in laser wavelength can be monitored during phase shift measurement. For this reason, issuing a warning when a change in wavelength is large and feeding it back to a measurement value allows more accurate measurement.

Fourth Embodiment

Figure 6:
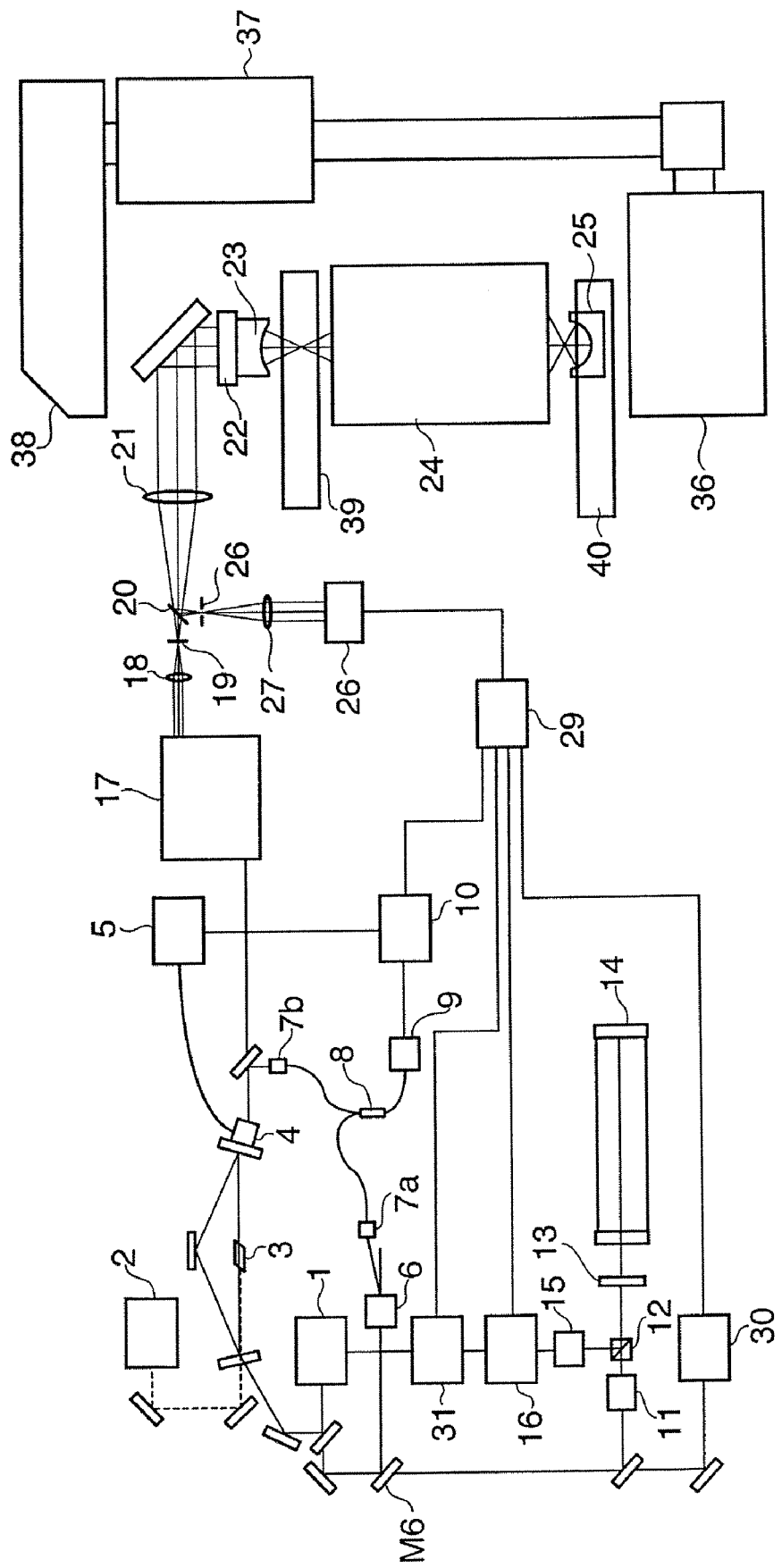
FIG. 6 is a view showing the schematic arrangement of an exposure apparatus according to the fourth embodiment of the present invention.
Figure 7:
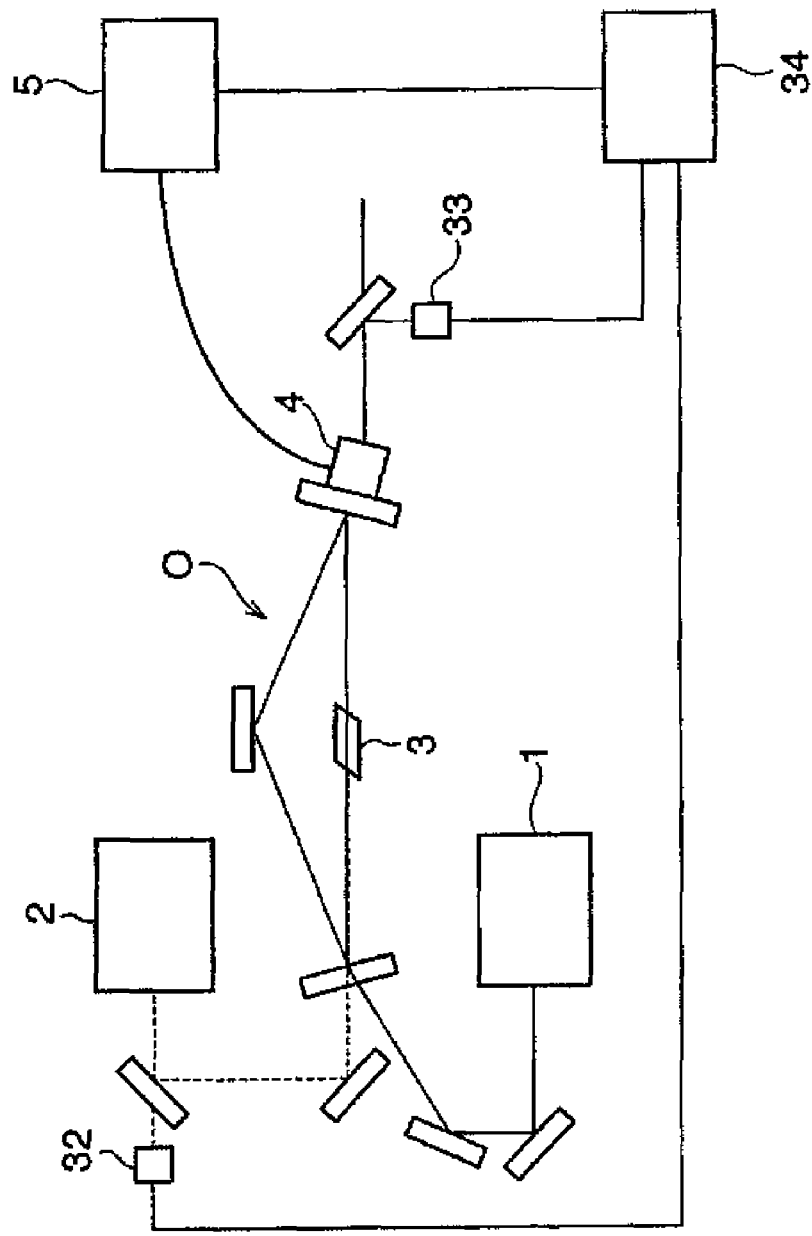
FIG. 7 is a view showing the schematic arrangement of a conventional injection-locked laser.

FIG. 6 is a view showing the schematic arrangement of an exposure apparatus according to the fourth embodiment of the present invention. The exposure apparatus according to the fourth embodiment of the present invention incorporates the interferometer according to the third embodiment.

Although a phase shift unit 22 and TS lens 23 are inserted in the optical path of exposure light in FIG. 6, they retreat from the optical path in actual exposure. Also in exposure, a wafer stage 40 is driven such that not an RS mirror 25 but an exposure target wafer (also called a substrate) is located on the image side of a projection optical system 24.

A light beam emitted by an excimer laser 36 is guided to an incoherent unit 37 via a transmission system. The incoherent unit 37 shapes the incident light beam and reduces the spatial coherence at the same time. The light beam which emerges from the incoherent unit 37 is guided to an illumination optical system 38 to make the illuminance uniform and generate a desired effective light source, and then illuminates a reticle (also called an original or mask) arranged on a reticle stage 39. The projection optical system 24 reduces and projects the incident light beam diffracted by the reticle pattern onto a wafer arranged on the wafer stage 40 to transfer the reticle pattern onto the wafer surface. After pattern transfer, the wafer stage 40 moves from the exposed area to the next exposure area step by step to expose it.

A method of measuring the wavefront aberration of the projection optical system 24 will be explained. Wavefront aberration measurement uses the interferometer described in the second embodiment. An interferometer light source maintains a stable wavelength which is set equal to that of the excimer laser 36. The phase shift unit 22 and TS lens 23 are driven from the retreat position during semiconductor exposure, and inserted at a desired object point on the projection optical system 24. In addition, the reticle stage 39 is driven to retreat the reticle arranged at the object point. The RS mirror 25 is set around a wafer holding unit of the wafer stage 40. When the wafer stage 40 is driven, the center of curvature of the RS mirror 25 becomes conjugate to the object point on the projection optical system 24. The above-described procedure allows an image sensor (CCD camera) 28 to sense interference fringes of test light and reference light beams. A wavefront is measured by the phase shift method using the phase shift unit 22, as in the third embodiment.

Since the fourth embodiment can use a laser having an accurately stabilized wavelength as the light source, a wavefront can be accurately measured on the semiconductor exposure apparatus. By optimizing the wavefront aberration of the projection optical system using the measurement result, its imaging performance can be optimized. This makes it possible to transfer a very fine pattern.

In the above embodiment, the beat signal is obtained by shifting a frequency of light emitted from the seed laser 1 by the acoustic optical modulator 6 and synthesizing the frequency-shifted light and light emitted from the oscillator O. However, the invention is not limited by that arrangement. For example, the beat signal can be obtained by shifting a frequency of light emitted from the oscillator O by the acoustic optical modulator 6 and synthesizing the frequency-shifted light and light emitted from the seed laser 1.

Other Embodiments

Figure 8:
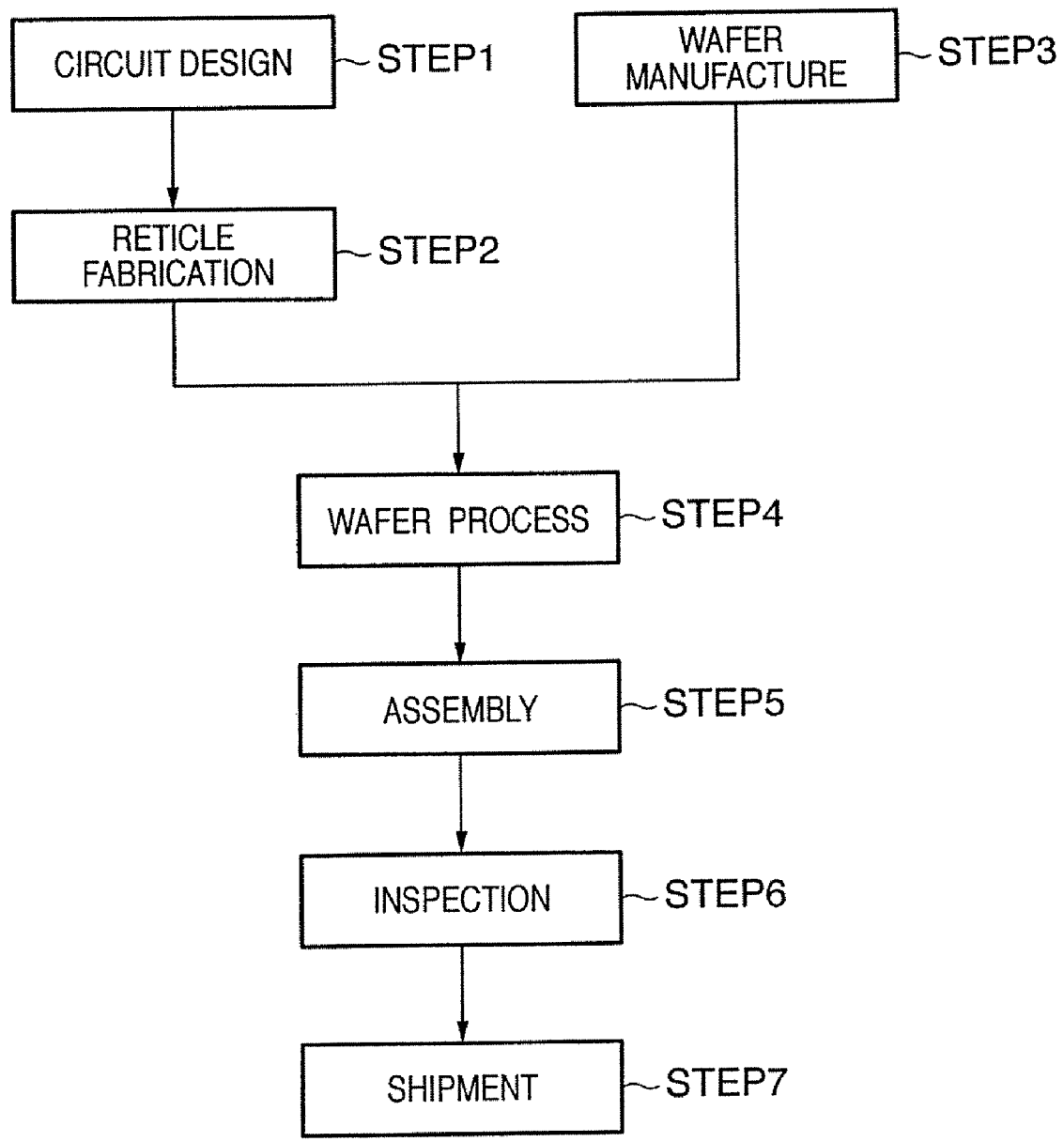
FIG. 8 is a flowchart illustrating the sequence of the overall semiconductor device manufacturing process.

A device manufacturing process using the above-described exposure apparatus will be described next. FIG. 8 is a flowchart illustrating the sequence of the overall semiconductor device manufacturing process. In step 1 (circuit design), the circuit of a semiconductor device is designed. In step 2 (reticle fabrication), a reticle is fabricated based on the designed circuit pattern. In step 3 (wafer manufacture), a wafer is manufactured using a material such as silicon. In step 4 (wafer process) called a preprocess, an actual circuit is formed on the wafer by lithography using the reticle and wafer. In step 5 (assembly) called a post-process, a semiconductor chip is formed using the wafer manufactured in step 4. This step includes processes such as assembly (dicing and bonding) and packaging (chip encapsulation). In step 6 (inspection), inspections including operation check test and durability test of the semiconductor device manufactured in step 5 are performed. A semiconductor device is completed with these processes and shipped in step 7.

Figure 9:
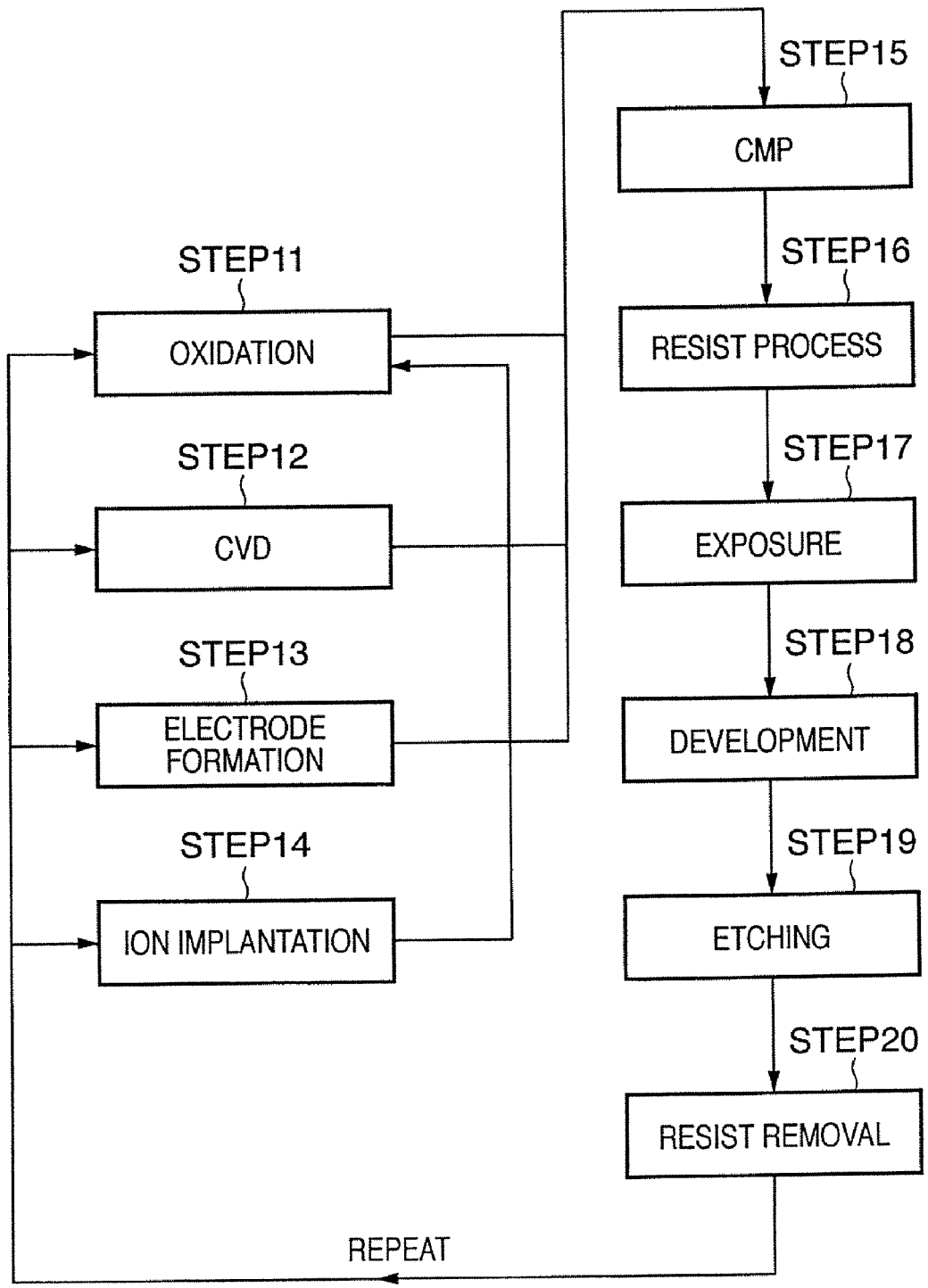
FIG. 9 is a flowchart illustrating the detailed sequence of the wafer process.

FIG. 9 is a flowchart illustrating the detailed sequence of the wafer process. In step 11 (oxidation), the wafer surface is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (CMP), the insulating film is planarized by CMP. In step 16 (resist process), a photosensitive agent is applied to the wafer. In step 17 (exposure), the above-described exposure apparatus is used to form a latent image pattern on the resist by exposing the wafer coated with the photosensitive agent to light via the mask on which the circuit pattern is formed. In step 18 (development), the latent image pattern formed on the resist on the wafer is developed to form a resist pattern. In step 19 (etching), the layer or substrate under the resist pattern is etched through a portion where the resist pattern opens. In step 20 (resist removal), any unnecessary resist remaining after etching is removed. By repeating these steps, a multilayered structure of circuit patterns is formed on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-302131 filed Nov. 7, 2006 and Japanese Patent Application No. 2007-273089 filed Oct. 19, 2007 which are hereby incorporated by reference herein in their entirety.

What is claimed is:

1. An injection-locked pulsed laser comprising:
   a seed laser;
   an oscillator into which a first portion of light output from said seed laser is injected as seed laser light;
   a frequency converter which shifts a frequency of light output from said oscillator;
   a photodetector which detects light obtained by synthesizing a second portion of the light output from said seed laser and the light output from said frequency converter; and
   a controller which controls an optical path length of said oscillator based on a beat signal component contained in the signal output from said photodetector.

2. The laser according to claim 1, wherein a frequency shift amount used in said frequency converter is larger than a spectral width of the light output from said oscillator.

3. The laser according to claim 1, wherein said frequency converter includes an acoustic optical modulator.

4. The laser according to claim 1, wherein said controller computes a frequency difference between the light output from said oscillator and the light output from said frequency converter based on a Fourier-transformation for the beat signal, and controls the optical path length of said oscillator based on the frequency difference.

5. The laser according to claim 1, further comprising a stabilization unit which stabilizes a wavelength of the light output from said seed laser.

6. The laser according to claim 5, wherein said stabilization unit includes a reference resonator and stabilizes the wavelength of the light output from said seed laser using a wavelength of the light output from said reference resonator as a reference.

7. The laser according to claim 5, wherein said stabilization unit includes a wavemeter which measures the wavelength of the light output from said seed laser, and stabilizes, on the basis of the output from said wavemeter, the wavelength of the light output from said seed laser.

8. An interferometer comprising:
   an injection-locked pulsed laser including a seed laser, an oscillator into which a first portion of light output from said seed laser is injected as seed laser light, a frequency converter which shifts a frequency of light output from said oscillator, a photodetector which detects light obtained by synthesizing a second portion of the light output from said seed laser and the light output from said frequency converter, and a controller which controls an optical path length of said oscillator based on a beat signal component contained in the signal output from said photodetector; and
   an interferometer which generates a reference light beam and a test light beam using light output from said injection-locked pulsed laser so that the reference light beam and the test light beam interfere with each other.

9. The interferometer according to claim 8, wherein said controller computes a frequency difference between the light output from said oscillator and the light output from said frequency converter based on a Fourier-transformation for the beat signal, and controls the optical path length of said oscillator based on the frequency difference.

10. An exposure apparatus comprising:
    an injection-locked pulsed laser including a seed laser, an oscillator into which a first portion of light output from said seed laser is injected as seed laser light, a frequency converter which shifts a frequency of light output from said oscillator, a photodetector which detects light obtained by synthesizing a second portion of the light output from said seed laser and the light output from said frequency converter, and a controller which controls an optical path length of said oscillator based on a beat signal component contained in the signal output from said photodetector;
    an interferometer which generates a reference light beam and a test light beam using light output from said injection-locked pulsed laser so that the reference light beam and the test light beam interfere with each other; and
    a projection optical system which projects a pattern of an original onto a substrate, wherein said interferometer measures an aberration of said projection optical system.

11. The exposure apparatus according to claim 10, wherein said controller computes a frequency difference between the light output from said oscillator and the light output from said frequency converter based on a Fourier-transformation for the beat signal, and controls the optical path length of said oscillator based on the frequency difference.

12. A device manufacturing method comprising the steps of:
forming a latent image pattern on a photosensitive agent applied to a substrate, using an exposure apparatus including an injection-locked pulsed laser, an interferometer which generates a reference light beam and a test light beam using light output from said injection-locked pulsed laser so that the reference light beam and the test light beam interfere with each other; and a projection optical system which projects a pattern of an original onto a substrate; and
developing the latent image pattern;
wherein the injection-locked pulsed laser includes a seed laser, an oscillator into which a first portion of light output from said seed laser is injected as seed laser light, a frequency converter which shifts a frequency of light output from said oscillator, a photodetector which detects light obtained by synthesizing a second portion of the light output from said seed laser and the light output from said frequency converter, and a controller which controls an optical path length of said oscillator based on a beat signal component contained in the signal output from said photodetector; and
wherein said interferometer measures an aberration of said projection optical system.

13. The device manufacturing method according to claim 12, wherein said controller computes a frequency difference between the light output from said oscillator and the light output from said frequency converter based on a Fourier-transformation for the beat signal, and controls the optical path length of said oscillator based on the frequency difference.

* * * * *